United States Patent
Permogorov

(10) Patent No.: US 11,258,226 B2
(45) Date of Patent: Feb. 22, 2022

(54) OPTICAL DEVICE

(71) Applicant: Redwave Labs Ltd, Oxfordshire (GB)

(72) Inventor: Dmitri Permogorov, Oxfordshire (GB)

(73) Assignee: Redwave Labs Ltd, Oxfordshire (GB)

(*) Notice: Subject to any disclaimer, the term of this patent is extended or adjusted under 35 U.S.C. 154(b) by 53 days.

(21) Appl. No.: 16/014,462

(22) Filed: Jun. 21, 2018

(65) Prior Publication Data

US 2018/0375284 A1 Dec. 27, 2018

(30) Foreign Application Priority Data

Jun. 21, 2017 (GB) ..................................... 1709922

(51) Int. Cl.
*H01S 5/065* (2006.01)
*H01S 3/30* (2006.01)
(Continued)

(52) U.S. Cl.
CPC ............ *H01S 3/302* (2013.01); *H01S 3/0675* (2013.01); *H01S 3/1055* (2013.01); *H01S 3/1305* (2013.01); *H01S 5/0064* (2013.01); *H01S 5/0656* (2013.01); *G02F 1/093* (2013.01); *H01S 3/10084* (2013.01); *H01S 3/10092* (2013.01); *H01S 5/005* (2013.01); *H01S 5/0071* (2013.01); *H01S 5/0078* (2013.01); *H01S 5/023* (2021.01);
(Continued)

(58) Field of Classification Search
CPC ....... H01S 5/0656; H01S 5/1021; H01S 5/142
See application file for complete search history.

(56) References Cited

U.S. PATENT DOCUMENTS 4,794,608 A 12/1988 Fujita et al.
4,884,276 A 11/1989 Dixon et al.
(Continued)

FOREIGN PATENT DOCUMENTS

CN 101924320 A 12/2010
WO 9632765 A 10/1996

OTHER PUBLICATIONS

Zhao et al. ("High-finesse cavity external optical feedback DFB laser with hertz relative linewidth", Nov. 15, 2012, vol. 37, No. 22, Optics Letters) (Year: 2012).*
(Continued)

*Primary Examiner* — Tod T Van Roy
(74) *Attorney, Agent, or Firm* — Troutman Pepper Hamilton Sanders LLP

(57) ABSTRACT

A narrow linewidth laser in which an all-optical feedback line-up is used to improve the linewidth from a conventional laser source, such as a laser diode. The feedback line-up comprises an optical device having a controllable unbalanced optical coupler arranged on a cavity input path to couple a source signal from the laser source into the optical cavity, and to couple a seed signal received back from the optical cavity into the laser source. The seed signal has a lower power than the source signal. The unbalanced optical coupler may be an optical isolator arranged to couple the seed signal into the laser source at a power level selected to promote preferential stimulated emission within a narrower linewidth. By controlling the power of seed signal such that only a small portion thereof influences the lasing cavity, the narrowing effect of the preferential stimulated emission can be enhanced.

20 Claims, 1 Drawing Sheet

(51) Int. Cl.
  H01S 5/00 (2006.01)
  H01S 3/067 (2006.01)
  H01S 3/1055 (2006.01)
  H01S 3/13 (2006.01)
  H01S 5/12 (2021.01)
  H01S 5/023 (2021.01)
  H01S 5/0233 (2021.01)
  H01S 5/0235 (2021.01)
  H01S 5/02326 (2021.01)
  H01S 3/10 (2006.01)
  G02F 1/09 (2006.01)

(52) U.S. Cl.
  CPC ........... *H01S 5/0233* (2021.01); *H01S 5/0235* (2021.01); *H01S 5/02326* (2021.01); *H01S 5/12* (2013.01); *H01S 2301/02* (2013.01)

(56) References Cited

U.S. PATENT DOCUMENTS

| | | | | |
|---|---|---|---|---|
| 4,907,237 A | | 3/1990 | Dahmani et al. | |
| 5,044,713 A | * | 9/1991 | Mozer | G02B 6/4209 385/11 |
| 5,052,786 A | * | 10/1991 | Schulz | G02F 1/093 359/484.03 |
| 5,111,330 A | * | 5/1992 | VanDelden | G02F 1/093 359/281 |
| 5,737,349 A | * | 4/1998 | Gaebe | G02F 1/093 372/37 |
| 6,449,091 B1 | * | 9/2002 | Cheng | G02F 1/093 356/365 |
| 8,964,185 B1 | * | 2/2015 | Luo | G01N 33/0036 356/436 |
| 9,304,080 B2 | * | 4/2016 | Kachanov | H01S 5/0028 |
| 2004/0202222 A1 | * | 10/2004 | Pocholle | G01C 19/66 372/75 |
| 2005/0073687 A1 | | 4/2005 | Morville et al. | |
| 2008/0310463 A1 | * | 12/2008 | Maleki | H01S 3/082 372/20 |
| 2010/0329287 A1 | * | 12/2010 | Lecomte | H01S 3/1305 372/3 |
| 2011/0216311 A1 | | 9/2011 | Kachanov et al. | |

OTHER PUBLICATIONS

Extended European Search Report for Patent Application No. 18178817.5 dated Nov. 19, 2018.
Labaziewicz et al., "Compact, Filtered Diode Laser System for Precision Spectroscopy", Optics Letters, vol. 32, No. 5, Mar. 1, 2007, pp. 572-574.
GB Search Report dated Dec. 13, 2017 during the prosecution of GB Patent Application No. GB 1709922.7.

\* cited by examiner

OPTICAL DEVICE

CROSS-REFERENCE TO RELATED APPLICATIONS

The present application claims priority from Great Britain Patent Application No. 1709922.7 filed on Jun. 21, 2017, the entire contents of which are hereby incorporated by reference.

FIELD OF THE INVENTION

The invention relates an optical device for generating a narrow linewidth laser beam. In particular, the invention relates to an optical device in which an all-optical feedback technique is used to narrow the linewidth output from a laser diode.

BACKGROUND TO THE INVENTION

The use of laser light in modern technology is ubiquitous. Some uses require the light output from the laser to occupy a very limited optical spectrum, i.e. to have a very small frequency bandwidth (referred to herein as a linewidth). Such lasers are typically known as "narrow linewidth" lasers.

Known types of semiconductor-based narrow linewidth lasers include distributed feedback (DFB) laser diodes and distributed Bragg (DBR) reflector lasers. These lasers may operate at wavelength from 400 to 1600 nm, and typically having a linewidth of the order of MHz. The linewidths that can be achieved in such device is typically limited by the grating.

Even narrower linewidth can be achieved using electro-optical modulation techniques, although this typically requires large cavities to be used together with additional high frequency modulation electronics.

Narrow linewidth laser find application in a variety of fields, such as sensors, metrology and communications.

SUMMARY OF THE INVENTION

At its most general, the present invention provides a narrow linewidth laser in which an all-optical feedback line-up is used to improve the linewidth from a conventional laser source, such as a laser diode.

According to the invention there may be provided an optical device comprising: a laser source; a passive optical cavity in optical communication with the laser source along a cavity input path; and an unbalanced optical coupler on the cavity input path, wherein the unbalanced optical coupler is arranged to couple a source signal from the laser source into the optical cavity, and to couple a seed signal received back from the optical cavity into the laser source, and wherein the seed signal has a lower power than the source signal. The optical cavity is a resonant structure that acts to filter the source signal to yield the seed signal. The seed signal may thus have a narrower linewidth than the source signal. The seed signal is used as a feedback mechanism, and is injected directly into the lasing cavity. Providing a narrower linewidth seed signal within the cavity acts to promote preferential stimulated emission within the narrower linewidth. The feedback may thus act to cause the source signal itself to have a narrow linewidth. In combination, these effects enable the optical device to provide a narrow linewidth laser in which the laser linewidth is substantially narrower than can be obtained from the laser source alone. For example, the linewidth of radiation from the optical device of the invention may be equal to or less than 600 Hz. It may lie in the range 300-500 Hz.

The unbalanced optical coupler may be any optical element with the ability to directionally limit optical power. For example, the unbalanced optical coupler may comprise an optical isolator, or the like. The unbalanced optical coupler may be arranged to couple the seed signal into the laser source at a power level selected to promote preferential stimulated emission within a narrower linewidth. The power level may be selected in conjunction with information about losses associated with a lasing cavity of the laser source. This is to ensure that the seed signal is not lost in the cavity, and to ensure that it does not dominate the lasing process. Moreover, by limiting the power of the signal returned back to the lasing element, the laser emission may still be adjustable over a useful range, e.g. to permit fine tuning of the laser emission to coincide exactly with cavity resonances. Having smaller feedback signal allows wider fine tuning (by laser current or temperature) to get exactly to the required wavelength.

By controlling the power of seed signal such that only a small portion thereof influences the lasing cavity, the narrowing effect of the preferential stimulated emission can be enhanced. Different types of laser may require different amount of feedback for optimal operation. The control provided by an optical isolator placed between cavity and the laser source enables the feedback to be varied so that the device is operable with a variety of laser sources. The seed signal may have an optical power than is 20 dB or more less than the optical power of the source signal, preferably 30 dB less, i.e. 1000 times less. For example, the optical isolator may allow the seed signal optical power to vary from 0.1% to about 10% of the source signal optical power.

In one example, the unbalanced optical coupler is arranged to ensure that the source signal has a first power that is equal to or greater than three orders of magnitude higher than the seed signal.

In this application, reference to a passive optical cavity may means that the optical cavity is not optically active, i.e. does not support stimulated emission at optical frequencies.

The optical device may be provided or packaged as a single unit or module. For example, the optical device may comprise a substrate on which the components are disposed. The substrate may be encased in a suitable housing to protect the components. The housing may have suitable input and output ports for connecting energy supply and for outputting an optical signal.

The laser source may be mounted on the substrate. The laser source may comprise a laser diode, e.g. a distributed feedback laser diode or the like. The laser source may be an off the shelf laser diode module, e.g. in TO-5 packaging or the like.

The optical cavity may be mounted on the substrate.

The substrate may be made from any suitable material. However, it may be advantageous to form the substrate from fused silica (quartz). The optical cavity may be formed integrally with the substrate, e.g. as a dielectric body that is part of the substrate.

It may be particularly advantageous to fabricate as much of the device as possible from the same material as the substrate. This can enable errors caused by temperature changes to be compensated in a straightforward manner.

The optical device may be compact. For example, the substrate may have a mounting area for receiving the laser and optical cavity, the mounting area having a size equal to or less than 50 mm×40 mm. The whole footprint of the device may fall within this size.

The optical cavity may comprise an output coupler arranged to transmit an output signal. The output signal may have the narrow linewidth discussed above.

The optical cavity may have any suitable configuration. In one example, it may be configured as a Fabry-Pérot cavity, e.g. with an optical path defined between one or more planar reflectors. Any suitable reflector may be used, provided it has the required reflectivity. It is desirable for reflectivity to be very high, i.e. equal to or greater than 99.95%. Each reflector may be a mirror, e.g. an optical element having a reflective coating formed on a surface (e.g. a planar and/or curved surface) thereof.

In one example, the optical cavity may comprise an optical path between a first cavity mirror and a second cavity mirror via an intermediate mirror. The first cavity mirror may be transmissive through is back surface to permit the source signal to enter into the optical cavity. The first cavity mirror, second cavity mirror, and the intermediate mirror The optical path may be in free space, or may be defined by a waveguide in order to minimise losses. In one example, the waveguide may comprise a hole formed in a dielectric body. The dielectric body may be an integral part of the substrate, as mentioned above. The first cavity mirror, second cavity mirror, and the intermediate mirror may be mounted on, e.g. secured or bonded to, the dielectric body.

The optical path may comprise a first path portion extending between the first cavity mirror and the intermediate mirror, and a second path portion extending between the intermediate mirror and the second cavity mirror, wherein the first path portion is disposed at an acute angle relative to the second path portion. The optical path may thus have a V-shape. This may be advantageous for provided a compact structure.

The optical cavity may have a resonant optical frequency that is within an output bandwidth of the laser source, and preferably matched to the laser frequency itself. This may maximise the effectiveness of the feedback.

The optical device may comprise other optical elements. For example, the optical device may include beam shaping optics mounted on the cavity input path between the laser source and the optical cavity. The beam shaping optics may include a first lens and a second lens, mounted before and after the unbalanced optical coupler along the cavity input path. The beam shaping optics may be arranged to ensure that the source signal is a light beam with the correct shape (e.g. beam width) to be received by the optical cavity.

The optical device may include a phase adjuster mounted on the cavity input path, wherein the phase adjuster includes an adjustable optical element for varying an optical length of the cavity input path. The adjustable optical element may be mounted on a piezoelectric adjuster, whose position on the substrate can be finely controlled through application of a voltage. The phase adjuster can be controller in real time both during initial set up and to perform adjustments to compensate for changes in temperature or the like.

The optical device may comprise a controller arranged to monitor and adjust operation of the laser and other components. For example, the controller may be arranged to control the phase adjuster. The device may have a power port for receiving electrical power from an external supply. The controller may be arranged to control the power supply to the laser to control an intensity of the source signal. One or more photodetectors may be mounted in the device to measure the source signal and/or the optical radiation within the optical cavity.

The optical device may find use in any context where a very narrow linewidth is desirable. For example, the device may be used in a gas sensor, e.g. a trace gas sensor, where the waveguide path is open to the environment to be sensed. The device may also find use in distance sensing applications, or gravimetry, or in quantum computing.

BRIEF DESCRIPTION OF THE DRAWINGS

Embodiments of the invention are described in detail below with reference to the accompanying drawings, in which.

DETAILED DESCRIPTION; FURTHER OPTIONS AND PREFERENCES

Figure 1:
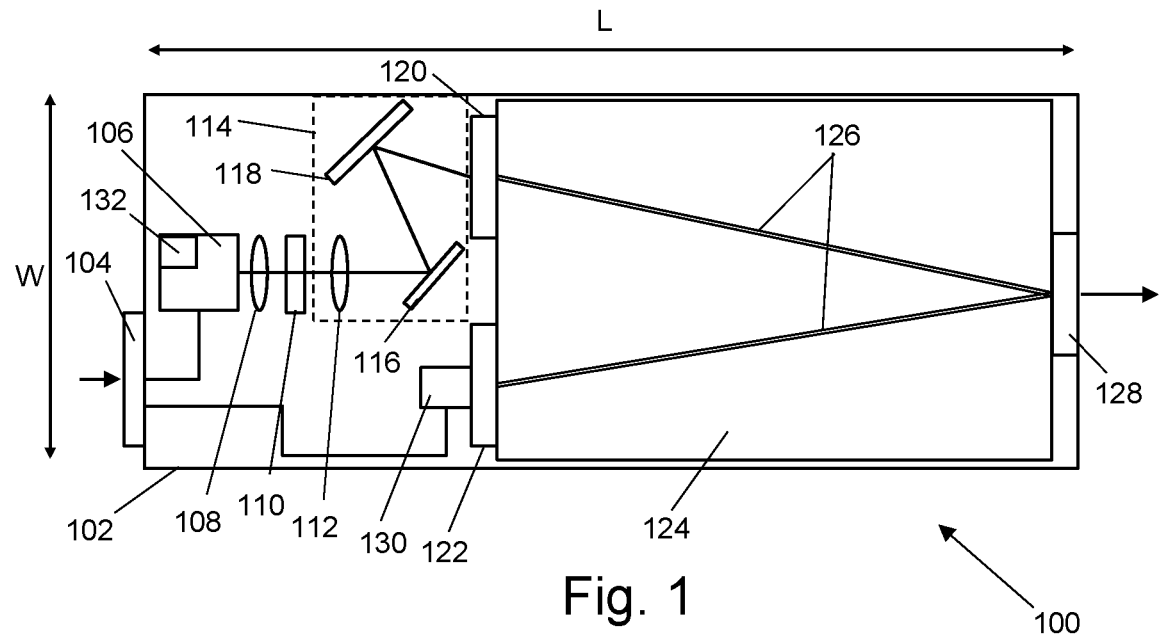
FIG. 1 is a schematic plan view of a narrow linewidth laser optical source that is an embodiment of the invention.

The present invention relates to an optical device configured to output a narrow linewidth laser beam using an all-optical technique. The optical device may be provided in a compact package, in which the linewidth narrowing optics are provided or integrated on the same substrate as a laser source, such as a diode laser. FIG. 1 is a schematic plan view of a narrow linewidth laser optical source 100 that is an embodiment of the invention. The optical source 100 comprises a substrate 102, e.g. made from fused silica. Components of the optical source 100 are either mounted or integrally formed on the substrate 102, as explained below.

A laser 106 is mounted on the substrate 102. The laser 106 may be a laser diode, such as a distributed feedback (DFB) laser diode, although other types of laser may be used, in which the gain of the laser is spectrally wider than the feedback (seed) signal. The laser 106 can be an off-the-shelf component that is bonded to the substrate. For example, the laser 106 may be a TO-5 laser diode package mounted on the substrate 102 and connected to an input power port 104 to receive electrical power for operation. In other examples, the laser may be fabricated directly on the substrate. The laser may operate at any suitable wavelength, e.g. 760 nm, 1064 nm, 1310 nm, 1550 nm, or any other wavelength used in fibre optic communication or for optical sensing purposes.

In operation, the laser 106 generates and emits a source signal, which is a laser light beam that is directed through an optical feedback line-up that is arranged to return a seed signal to the laser 106 in order to narrow the linewidth of the source signal.

The source signal from the laser 106 is directed into a first lens 108 which is a mode matching lens for beam shaping. The output from the first lens 108 is directed into a second lens 112. Together the first lens 108 and second lens 112 ensure that the source signal forms a laser beam having the correct size for entering an optical cavity 124, as discussed below.

An optical isolator 110 is mounted between the first lens 108 and the second lens 112. Mounting the optical isolator in this location means that it can have a small size because the waist size of the optical beam may be at a minimum (e.g. around 0.3 mm) between the first lens 108 and second lens 112. In other examples. the optical isolator may be inserted in other positions, e.g. close to the cavity. But in these examples, the physical size of the optical isolator will be larger.

The optical isolator 110 is arranged to inhibit propagation of optical radiation back towards the laser 106. As discussed below, the optical isolator 110 acts to limit an intensity of the seed signal returned from the optical feedback line-up. In practice, the optical isolator 110 may be designed to block a certain wavelength that is at or closely adjacent to the wavelength of the laser, whereby the degree of isolation at the wavelength of the laser is appropriate to allow sufficient optical isolation and good fine tuning range for the wavelength. For example, the seed signal may have a power that is more than three orders of magnitude smaller than the source signal. In one example, the source signal transmitted by the optical isolator 110 may have a power of 10 mW, and the seed signal that is returned through the optical isolator 110 may have a power of 1 µW. The optical isolator 110 thus acts as an unbalanced optical coupler in which reflected optical power returning to the laser is attenuated or limited to a greater extent than transmitted optical power from the laser.

The source signal form the second lens 112 is directed into a phase adjuster unit 114. In this example, the phase adjuster unit 114 comprises a static mirror 116 and an adjustable mirror 118. The adjustable mirror 118 is mounted on a movable platform, so that its position relative to the static mirror 116 can be adjusted. The movable platform may be controlled by a piezoelectric adjuster, in a conventional manner.

The source signal transmitted by the phase adjuster unit 114 is directed into an optical cavity 124 through a first cavity mirror 120. The optical cavity 124 is a passive Fabry-Pérot cavity formed between a pair of cavity mirrors having very high reflectivity. In the example shown in FIG. 1, the Fabry-Pérot cavity is formed between the first cavity mirror 120 and a second cavity mirror 122, which may be curved to provide a narrow resonance condition for the cavity. To provide a compact cavity, the optical path between the first cavity mirror 120 and the second cavity mirror 122 includes a reflection at an intermediate mirror 128. The optical path between the first cavity mirror 120 and the second cavity mirror 122 is V-shaped, i.e. has two path portions extending at an acute angle relative to each other. All of the mirrors in the optical cavity 124 have a very high reflectivity, e.g. equal to or greater than 99.995%.

The optical cavity 124 in the example shown in FIG. 1 comprises an optical path between the first cavity mirror 120 and second cavity mirror 122 provided by a waveguide 126. The waveguide 126 in this example is a hole (e.g. filled with air) formed in (e.g. drilled in) a block of dielectric material. In this example, the dielectric material is fused silica (and indeed may be an integral part of the substrate 102), but other materials may be used. The mirrors may be fabricated directed on to the waveguide or substrate. However, in a preferred arrangement, the mirrors area attached to the substrate via three independent mounts, which may be adjustable to compensate for manufacturing tolerances.

To ensure that the seed signal is received correctly at the laser, a distance between the second lens 112 and the first cavity mirror 120 is set to be equal to the length of the optical cavity (i.e. the distance between the first cavity mirror 120 and the second cavity mirror 122 along the waveguide 126). FIG. 1 is a schematic drawing and does not show this distance to scale.

The distance between the second lens 112 and the first cavity mirror 120 can be set at a coarse level during assembly of the components on the substrate 102. Fine adjustment can be done during laser operations, e.g. by adjusting the position of adjustable mirror 118 by applying a suitable voltage to the piezoelectric adjuster. In this way, the distance between the second lens 112 and the first cavity mirror 120 can be precisely matched to the length of the optical cavity.

In the arrangement of FIG. 1, the intermediate mirror 128 also acts as an output coupler for transmitting an output signal from the waveguide.

The operation principles of the optical source 100 are now discussed. The passive Fabry-Pérot cavity with virtually loss-free mirrors possesses a comb-type transmission function with very narrow and sharp peaks. The cavity may thus act as a filter to reduce the background amplified spontaneous emission (ASE) associated with the source signal. This filtered signal is used as the seed signal that is feed back to the laser 106. The seed signal acts to enhance the natural loss mechanism within the lasing cavity itself, which has the effect of narrowing the linewidth of the source signal that is emitted from the laser 106. In combination, the effect of the feedback seed signal in the laser and the filtering function of the optical cavity act to narrow the linewidth of the output signal using only optical techniques.

Figure 2:
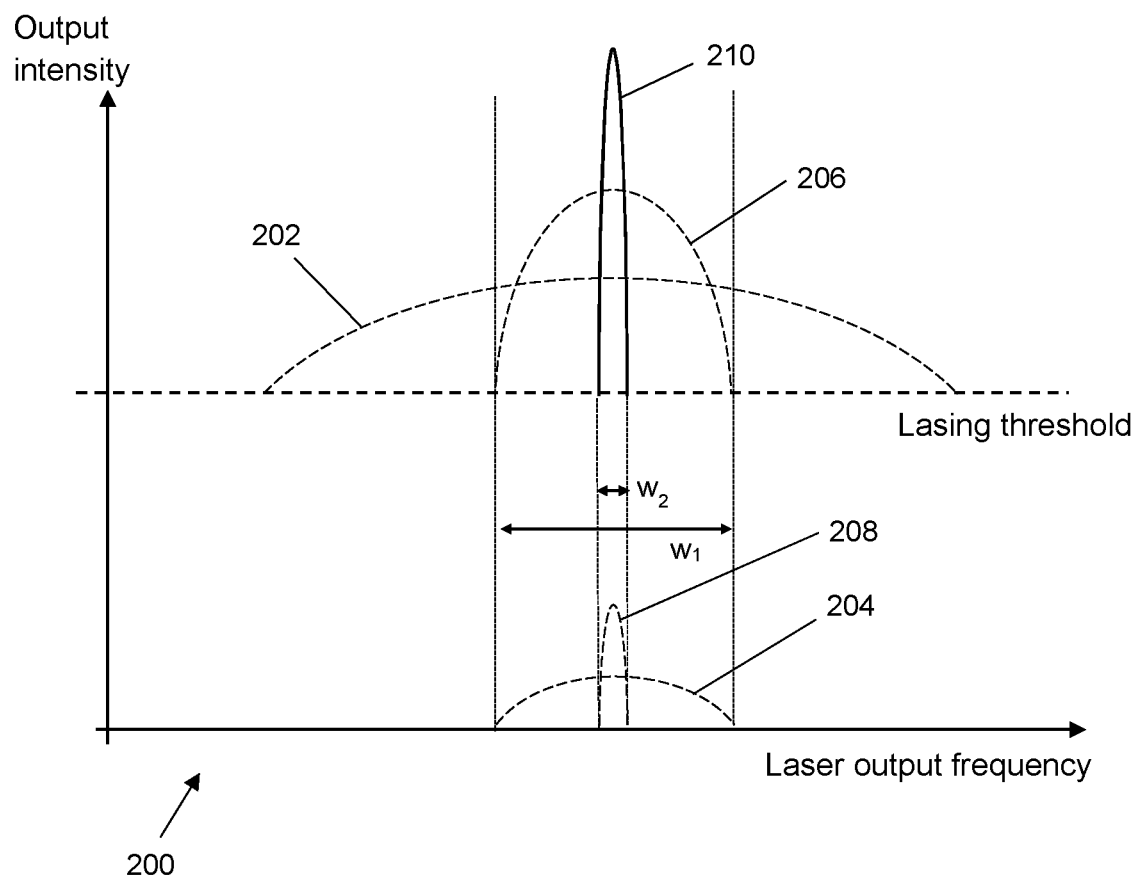
FIG. 2 is a graph illustrating the operating principles of the invention.

FIG. 2 is a graph of output intensity against frequency that illustrates the effects described above. For any given gain medium in a laser, operation above lasing threshold yields a band of frequencies associated with the stimulated emission and amplified spontaneous emission (ASE). Typically, lasers include means for restricting the band 202 by absorbing or filtering the unwanted background ASE radiation. In a distributed feedback laser diode this is done using a grating, which operates as a narrow band reflector. A typical transmission function 204 for such a grating is shown in FIG. 2. Using such a grating has the effect of narrowing the output linewidth, as shown by the typical laser diode output 206 shown in FIG. 2. Laser diode output 206 has a linewidth of $w_1$, which in practice may be about 1 MHz.

The filtering function of the passive Fabry-Pérot cavity discussed above will have a linewidth of about 30 kHz. This is shown schematically (i.e. not to scale) in FIG. 2 as a seed signal 208 having linewidth of $w_2$.

By balancing the losses in the lasing cavity of the laser 106 with the power level of the seed signal that is returned to the lasing cavity, it is possible to ensure that only the top 1-2% of the seed signal actively contributes to feedback within the lasing cavity. This may thus provide a narrowing effect that enables linewidths of equal to or less 0.6 kHz to be achieved, as illustrated by the narrowed source signal 210 in FIG. 2. The optical source of the invention may thus be used to generate a laser beam having a linewidth in the range 0.3 to 0.6 kHz (i.e. 300-600 Hz) using a conventional laser diode. In practice, the narrowing effect may be achieved by selecting an optical isolator that provides the desired response at the wavelength of the laser. This may be an optical isolator designed to inhibit transmission of a different wavelength (e.g. within 1 to 5 nm of the laser wavelength).

Laser operation may be controlled in real time by providing a pair of photodiodes 130, 132. A first photodiode 130 is mounted to monitor optical radiation in the cavity. For example, the first photodiode may be mounted at the second cavity mirror 122, where it can receive the tiny loss signal as an input. A second photodiode 132 may be mounted to monitor operation of the laser 106 itself. The photodiodes 130, 132 provide measurements of intensity that allow control of the intensity and stability of the laser.

As discussed above, all the components of the device are mounted on the fused silica substrate 102. Furthermore, all supporting elements for lenses, mirrors, photodiodes and laser are preferably made of fused silica as well. The device is thus constructed as far as possible using a common material, which means that it has a uniform temperature expansion coefficient. The device may be arranged to adjust for variations in temperature in a conventional manner.

One advantage of the all-optical feedback technique discussed above is that the device can be provided in a compact package. For example, in one arrangement the substrate may have a length L of equal to or less than 50 mm and a width W equal to or less than 40 mm.

The device may find use in any context where a narrow linewidth is desirable. In one example, the device may be used as or in an optical sensor, e.g. for detecting the presence of one or more chemical materials, particularly gaseous materials. Changes in the dielectric constant of the material through which the optical radiation propagates in the optical cavity can be detected as shifts in the output frequency. Providing a narrower linewidth permits detection to be achieved with greater sensitivity.

Another possible application of the invention lies in acousto-optic sensing, where laser light is launched into an optical fibre and reflection back from the same fibre is measured. Interrogation of the reflected signal can permit one to 'listen' to what is happening along the fibre length. This technique can be used with fibre lengths up to 50 km, where areas of potential problem can be located within a resolution of 1-2 metres, and acoustic frequencies of up to 2 kHz can be resolved. The present invention can provide a purer input signal when applied in this field, e.g. because the cavity ensures that the signal has a very high side mode suppression ratio as well as providing very high filtering of Amplified Spontaneous Emission (ASE).

The invention claimed is:

1. An optical device comprising:
   a laser source;
   a passive optical cavity in optical communication with the laser source along a cavity input path; and
   an unbalanced optical coupler on the cavity input path,
   wherein the unbalanced optical coupler is an optical isolator arranged to couple a source signal from the laser source into the optical cavity, and to couple a seed signal from the optical cavity into a lasing cavity of the laser source,
   wherein the unbalanced optical coupler is operable to attenuate the seed signal returned from the optical cavity so that an optical power of the seed signal is lower than an optical power of the source signal, and
   wherein the optical device is configured to balance losses of the lasing cavity with the optical power of the seed signal by using the optical isolator to select a proportion of the seed signal output from the optical cavity to actively contribute to feedback within the lasing cavity, thereby to cause a linewidth of a signal output from the optical device to be at least an order of magnitude smaller than a linewidth of the seed signal output from the optical cavity and the linewidth of the signal output from the optical device is equal to or less than 0.6 kHz.

2. An optical device according to claim 1, wherein the optical isolator is configured to block transmission of a wavelength within 1 to 5 nm of a wavelength of the laser source.

3. An optical device according to claim 1, wherein the source signal has a first power that is equal to or greater than three orders of magnitude higher than the seed signal.

4. An optical device according to claim 1 comprising a substrate, wherein the laser source and optical cavity are mounted on or formed integrally with the substrate.

5. An optical device according to claim 4, wherein the substrate is made from fused silica.

6. An optical device according to claim 4, wherein the substrate has a mounting area for receiving the laser and optical cavity, the mounting area having a size equal to or less than 50 mm×40 mm.

7. An optical device according to claim 1, wherein the laser source comprises a laser diode module.

8. An optical device according to claim 1, wherein the optical cavity comprises an output coupler arranged to transmit an output signal.

9. An optical device according to claim 1, wherein the optical cavity is configured as a Fabry-Pérot cavity.

10. An optical device according to claim 9, wherein the optical cavity comprises an optical path between a first cavity mirror and a second cavity mirror via an intermediate mirror.

11. An optical device according to claim 10, wherein the first cavity mirror, second cavity mirror, and the intermediate mirror have a reflectivity equal to or greater than 99.95%.

12. An optical device according to claim 10, wherein the optical path is a waveguide.

13. An optical device according to claim 12, wherein the waveguide comprises a hole formed in a dielectric body, and wherein the first cavity mirror, second cavity mirror, and the intermediate mirror are mounted on the dielectric body.

14. An optical device according to claim 10, wherein the optical path comprises a first path portion extending between the first cavity mirror and the intermediate mirror, and a second path portion extending between the intermediate mirror and the second cavity mirror, wherein the first path portion is disposed at an acute angle relative to the second path portion.

15. An optical device according to claim 1, wherein the optical cavity has a resonant optical frequency that is within an output bandwidth of the laser source.

16. An optical device according to claim 1 comprising beam shaping optics mounted on the cavity input path between the laser source and the optical cavity.

17. An optical device according to claim 1 comprising a phase adjuster mounted on the cavity input path, wherein the phase adjuster includes an adjustable optical element for varying an optical length of the cavity input path.

18. The optical device of claim 1, wherein the proportion of the seed signal output from the optical isolator that actively contributes to feedback within the lasing cavity is 1-2%.

19. The optical device of claim 1, further comprising a first lens and a second lens, wherein the first lens and the second lens are located between the laser source and the optical cavity, and the unbalanced optical coupler is located between the first lens and the second lens.

20. The optical device of claim 19, wherein the optical cavity comprises an optical path between a first cavity mirror and a second cavity mirror via an intermediate mirror, a distance between the second lens and the first cavity mirror is equal to a distance between the first cavity mirror and the second cavity mirror.

* * * * *